United States Patent [19]

Genduso et al.

[11] Patent Number: 5,794,019
[45] Date of Patent: Aug. 11, 1998

[54] PROCESSOR WITH FREE RUNNING CLOCK WITH MOMENTARY SYNCHRONIZATION TO SUBSYSTEM CLOCK DURING DATA TRANSFERS

[75] Inventors: Thomas Basilio Genduso, Apex, N.C.; Joseph Michael Mosley, Boca Raton, Fla.

[73] Assignee: International Business Machines Corp., Armonk, N.Y.

[21] Appl. No.: 787,556

[22] Filed: Jan. 22, 1997

[51] Int. Cl.$^6$ .................................................. G06F 1/12
[52] U.S. Cl. ................................................... 395/551
[58] Field of Search ............................. 395/551, 200.78, 395/881, 555

[56] References Cited

U.S. PATENT DOCUMENTS

| | | |
|---|---|---|
| 4,827,401 | 5/1989 | Hrustich et al. ........................ 395/551 |
| 4,978,927 | 12/1990 | Hausman et al. ....................... 331/57 |
| 5,396,111 | 3/1995 | Frangioso et al. ...................... 327/144 |
| 5,428,754 | 6/1995 | Baldwin ................................. 395/375 |
| 5,450,458 | 9/1995 | Price et al. ............................. 375/356 |
| 5,504,927 | 4/1996 | Okamoto et al. ....................... 395/878 |
| 5,537,582 | 7/1996 | Draeger ................................. 395/552 |

*Primary Examiner*—Thomas M. Heckler
*Attorney, Agent, or Firm*—Martin J. McKinley

[57] ABSTRACT

A processor clock (302) is momentarily synchronized to a subsystem clock (307) during transfers of data between a processor (301) and a subsystem (305). After the completion of the data transfer, synchronization is disabled and the processor clock runs asynchronously at its own internal frequency, which is higher than the subsystem clock frequency. In one embodiment, the processor clock uses a free running ring oscillator (401) that is constructed on the same integrated circuit chip as the processor. Changes in temperature and power supply voltage not only cause changes in the maximum operating speed of the processor, but they also cause corresponding changes in the frequency of the processor clock. Thus, the frequency of the processor clock tracks changes in the maximum operating speed of the processor caused by temperature and power supply variations.

4 Claims, 7 Drawing Sheets

| | CURRENT STATE | $C_i$ | $C_e$ | $SYNC_{in}$ | $SYNC_{out}$ | $C_o$ | NEXT STATE |
|---|---|---|---|---|---|---|---|
| 1 | $S_i$ | 1 | NC | 0 | 0 | 1 | $S_i$ |
| 2 | $S_i$ | 0 | NC | 0 | 0 | 0 | $S_i$ |
| 3 | $S_i$ | 1 | 1 | 1 | 0 | 1 | $S_a$ |
| 4 | $S_i$ | 0 | 0 | 1 | 0 | 0 | $S_a$ |
| 5 | $S_i$ | 1 | 0 | 1 | 0 | 1 | $S_c$ |
| 6 | $S_i$ | 0 | 1 | 1 | 0 | 0 | $S_c$ |
| 7 | $S_a$ | 1 | 0 | 1 | 0 | 1 | $S_b$ |
| 8 | $S_a$ | 0 | 1 | 1 | 0 | 0 | $S_b$ |
| 9 | $S_c$ | 1 | 1 | 1 | 0 | 1 | $S_a$ |
| 10 | $S_c$ | 0 | 0 | 1 | 0 | 0 | $S_a$ |
| 11 | $S_b$ | 1 | 1 | 1 | 0 | 1 | $S_e$ |
| 12 | $S_b$ | 0 | 0 | 1 | 0 | 0 | $S_e$ |
| 13 | $S_e$ | NC | 0 | 1 | 1 | 0 | $S_e$ |
| 14 | $S_e$ | NC | 1 | 1 | 1 | 1 | $S_e$ |
| 15 | $S_e$ | 0 | 0 | 0 | 0 | 0 | $S_i$ |
| 16 | $S_e$ | 1 | 1 | 0 | 0 | 1 | $S_i$ |

NC - DON'T CARE

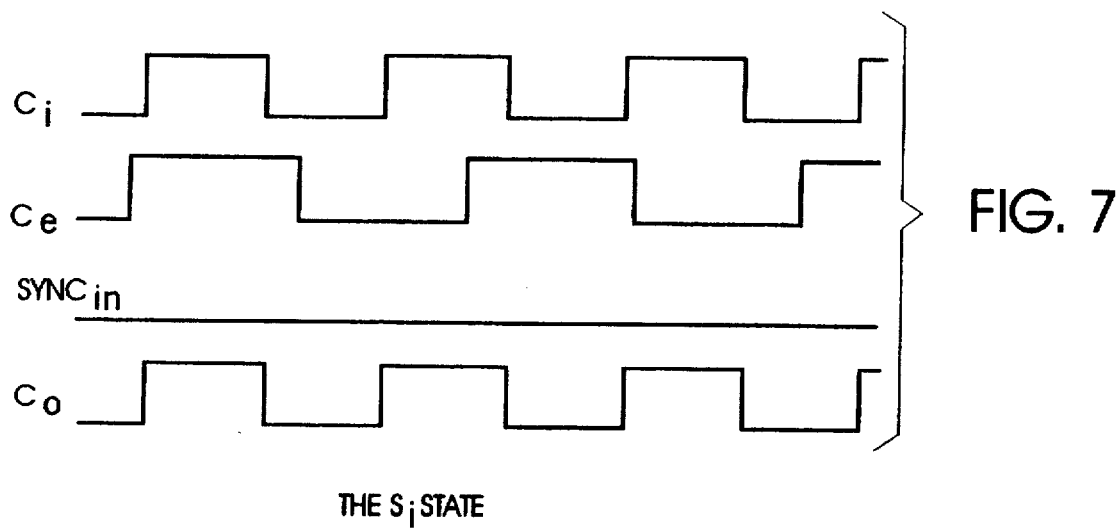
FIG. 7
THE $S_i$ STATE
FIG. 8
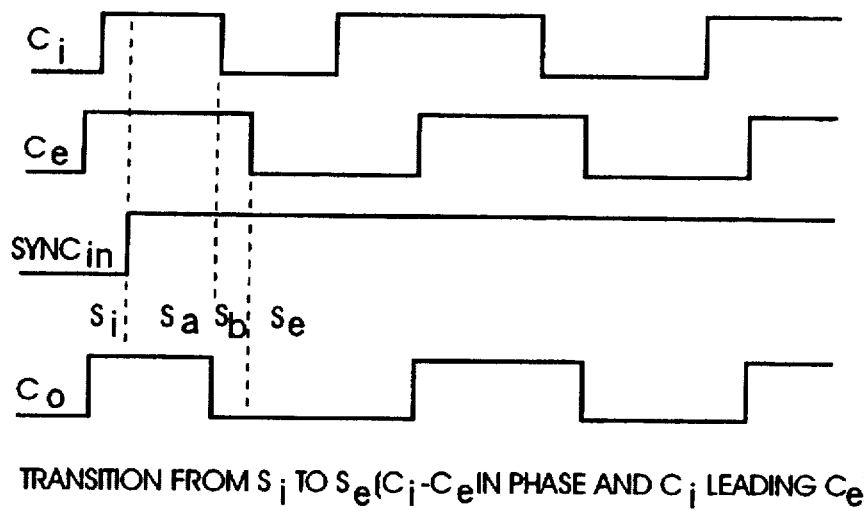
TRANSITION FROM $S_i$ TO $S_e$ ($C_i$-$C_e$ IN PHASE AND $C_i$ LEADING $C_e$)

TRANSITION FROM $S_i$ TO $S_e$ ($C_i$-$C_e$ IN PHASE AND $C_i$ LEADING $C_e$)

TRANSITION FROM $S_i$ TO $S_e$ ($C_i$-$C_e$ IN PHASE AND $C_i$ LEADING $C_e$)

TRANSITION FROM $S_i$ TO $S_e$ ($C_i$-$C_e$ IN PHASE AND $C_i$ LEADING $C_e$)

TRANSITION FROM $S_e$ TO $S_i$

PROCESSOR WITH FREE RUNNING CLOCK WITH MOMENTARY SYNCHRONIZATION TO SUBSYSTEM CLOCK DURING DATA TRANSFERS

BACKGROUND OF THE INVENTION

This invention pertains to computers and other information handling systems and, more particularly, to a computer system having separate and generally asynchronous processor and subsystem clocks, wherein the processor clock is momentarily synchronized to the subsystem clock during transfers of data between the processor and the subsystem. Furthermore, this invention also pertains to processor and other subsystem clocks that are free running and integrated with the processor or other subsystem integrated circuit chip, such that the frequency of the clock is determined in part by the temperature of the chip and the power supply voltage applied to the chip.

FIG. 1 illustrates a prior art computer system having a fixed frequency processor clock 101 and a frequency divider 102 for generating the subsystem clock. Referring to this figure, data can be transferred between a processor 103 and a subsystem 104. The fixed frequency clock 101 supplies its clock signal directly to processor 103, and indirectly to subsystem 104 through divider 102. Divider 102 generates the subsystem clock by dividing the frequency of the processor clock 101 by some predefined number. Consequently, the processor and subsystem clocks are always synchronized, and the frequency of the processor clock is always a multiple of the subsystem clock frequency.

Subsystem 104 typically includes a subsystem bus (not illustrated) and a plurality of addressable "adapters" or "devices" (not illustrated) coupled to the subsystem bus. The design of the subsystem bus, as well as the design of any devices coupled to that bus, sets the maximum allowable subsystem clock frequency, which should not be exceeded.

If the maximum operating frequency of processor 103 is multiple of the maximum subsystem clock frequency, both the processor and the subsystem can operate at their maximum frequency. For example, if the maximum operating frequency of processor 103 is 66 MHz and subsystem 104 includes a 33 MHZ PCI bus, processor clock 101 can operate at 66 MHz and, by dividing by 2, the subsystem clock frequency will be 33 MHZ. Therefore, both processor 103 and subsystem 104 operate at their maximum frequency.

As new processors are introduced, the maximum operating frequencies of these new processors cannot always be divided down to obtain the maximum subsystem frequency. For example, in a system with a 75 MHZ processor 103 and a 33 MHZ PCI subsystem bus, there is no integer divisor that can reduce the 75 MHZ processor clock to 33 MHZ. Dividing the 75 MHZ processor clock by 2 produces a 37.5 MHZ subsystem clock, which exceeds the maximum allowable subsystem clock frequency and is, therefore, unusable. Dividing the 75 MHZ processor clock by 3 produces a 25 MHZ subsystem clock which is usable, but results in a subsystem clock that is 8 MHZ below the maximum allowable subsystem clock frequency. Consequently, in a system as illustrated in FIG. 1 and employing a 33 MHZ subsystem bus, the speed advantage in moving from a 66 MHZ to a 75 MHZ processor may be illusory. In other words, the gain in processor speed may be offset by the loss of subsystem bus speed.

FIG. 2 illustrates a prior art computer system that provides one solution to the problem identified immediately above. Referring to this figure, data can be transferred between a processor 201 and a subsystem 202 through an interface unit 203. The processor clock 204 and the subsystem clock 205 are fixed frequency, independent and asynchronous clocks with no requirement that the frequency of one clock be some multiple of the frequency of the other clock. Thus, processor 201 and subsystem 202 each run within their own independent "clocking envelopes" and interface unit 203 handles the transfer of data between these two envelopes. While this system permits processor 201 and subsystem 202 to both operate at their maximum allowable operating frequency, there are a number of problems and limitations associated with the interface unit and its function of accepting data from one clocking envelope and re-synchronizing it to the clock of another envelope.

For integrated circuit processor chips, the maximum operating (clocking) frequency of the processor varies with the temperature and power supply voltage. For example, increase the temperature and the maximum operating frequency usually goes down. However, the maximum operating frequency is usually only specified as a single frequency, and that single frequency is specified under worst case conditions of temperature and power supply voltage. Consequently, the frequency of the processor clock is usually set to equal the maximum operating frequency specification which, under actual conditions of temperature and voltage, may be two or more times slower than the maximum operating capability of the processor.

To overcome many of the problems and limitations of the prior art, a computer system is described below in which the processor clock and subsystem clock are independent and asynchronous, except during transfers of data between the processor and subsystem. During data transfers, the processor clock is momentarily synchronized to the subsystem clock and upon completion of the transfer, the processor clock is returned to its asynchronous mode and frequency. Although, in its asynchronous mode, the processor clock may operate at a fixed frequency, a free running oscillator may also be used as part of the processor clock. This free running oscillator is preferably constructed directly on the same integrated circuit chip as the processor, such that the frequency of the oscillator will vary with changes in temperature and power supply voltage.

SUMMARY OF THE INVENTION

Briefly, the invention is a computer system that includes an integrated circuit chip having a processor and a processor clock. The processor includes a plurality of gates, and the processor clock includes a free running, variable frequency oscillator. In an asynchronous mode, the frequency of the processor clock is determined in part by the temperature of the chip and the power supply voltage applied to the chip. Thus, as the propagation delay of the gates decreases with changes in temperature and voltage, the frequency of the processor clock increases. Similarly, as the propagation delay of the gates increases with changes in temperature and voltage, the frequency of the processor clock decreases. The computer system also includes a subsystem having a subsystem clock. The computer subsystem is coupled to the processor such that data can be transferred between the processor and the subsystem. A signaling means generates a synchronizing signal that precedes a transfer of a block of data between the processor and the subsystem. Also included is a synchronizing means that provides momentary synchronization of the processor clock and the subsystem clock. The momentary synchronization is initialized by the synchronizing signal and terminated upon the completion of the transfer of data. Thus, the processor clock can operate in an asynchronous mode in which the processor clock and the subsystem clock are unsynchronized, or in a synchronous mode in which the processor clock is synchronized to the subsystem clock. The synchronous mode is used during the transfer of data.

In another embodiment, the invention is a computer system that includes a processor and a processor clock coupled to the processor. A computer subsystem includes a subsystem clock. The subsystem is coupled to the processor such that data can be transferred between said processor and the subsystem. Signaling means are provided for generating a synchronizing signal that precedes a transfer of a block of data between the processor and the subsystem. The computer system also includes synchronizing means for providing momentary synchronization of the processor clock and the subsystem clock. The momentary synchronization is initialized by the synchronizing signal and terminates upon the completion of the transfer of the block of data. Thus, the processor clock can operate in an asynchronous in which the processor clock and the subsystem clock are unsynchronized, or in a synchronous mode in which the processor clock is synchronized to the subsystem clock. The synchronous mode is used during the transfer of a block of data.

BRIEF DESCRIPTION OF THE DRAWINGS

FIG. 7 is a timing diagram illustrating the $S_i$ state of FIGS. 5-6.

FIG. 8 is a timing diagram illustrating the $S_i$ to $S_e$ state transition wherein $C_i$ and $C_e$ have the same polarity when $SYNC_{in}$ transitions active, and wherein $C_i$ leads $C_e$.

DESCRIPTION OF THE ILLUSTRATIVE EMBODIMENTS

Figure 1:
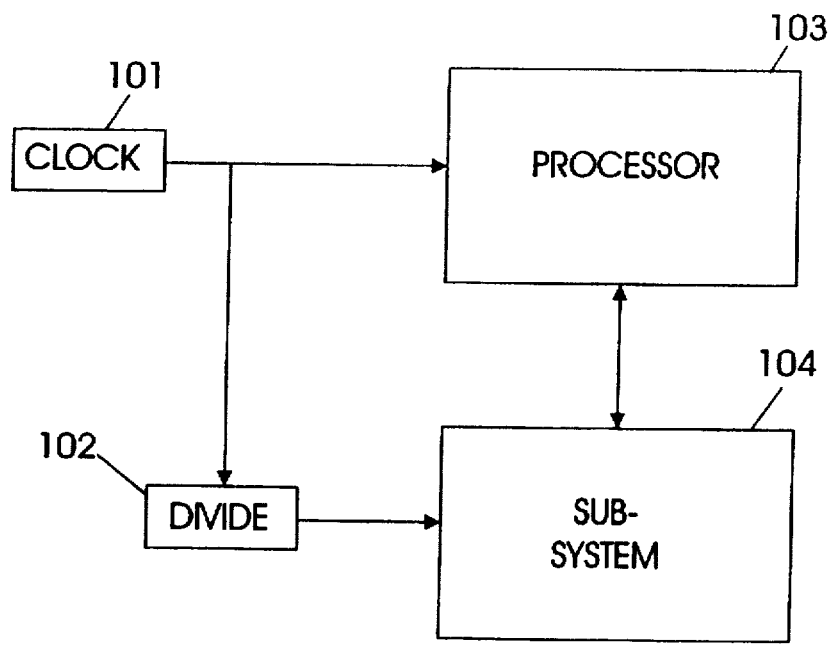
FIG. 1 is a block diagram of a prior art computer system in which the processor clock frequency is an integer multiple of the subsystem clock frequency.
Figure 2:
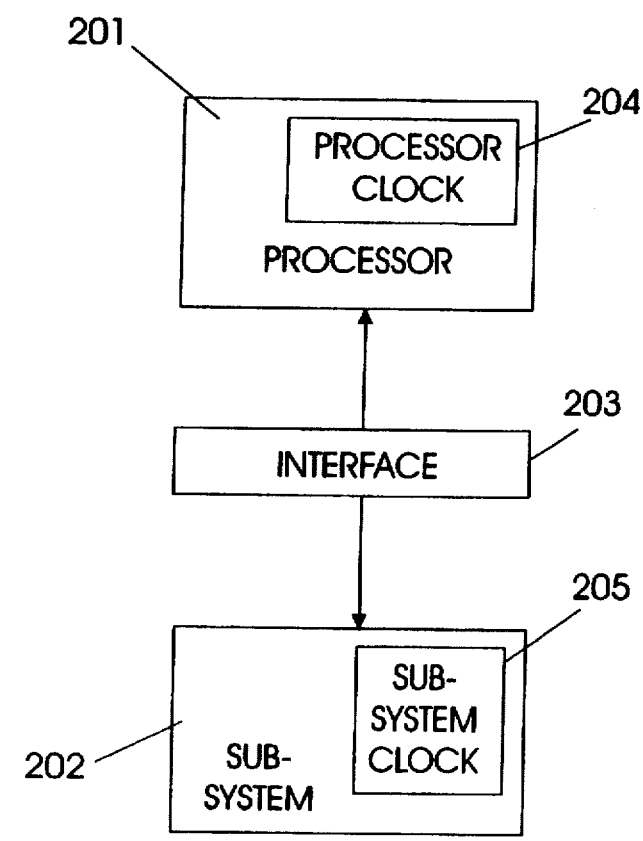
FIG. 2 is a block diagram of a prior art computer system in which the processor and subsystem are each in separate, asynchronous clocking envelops, and data is passed between the two envelopes through an interface unit.
Figure 3:
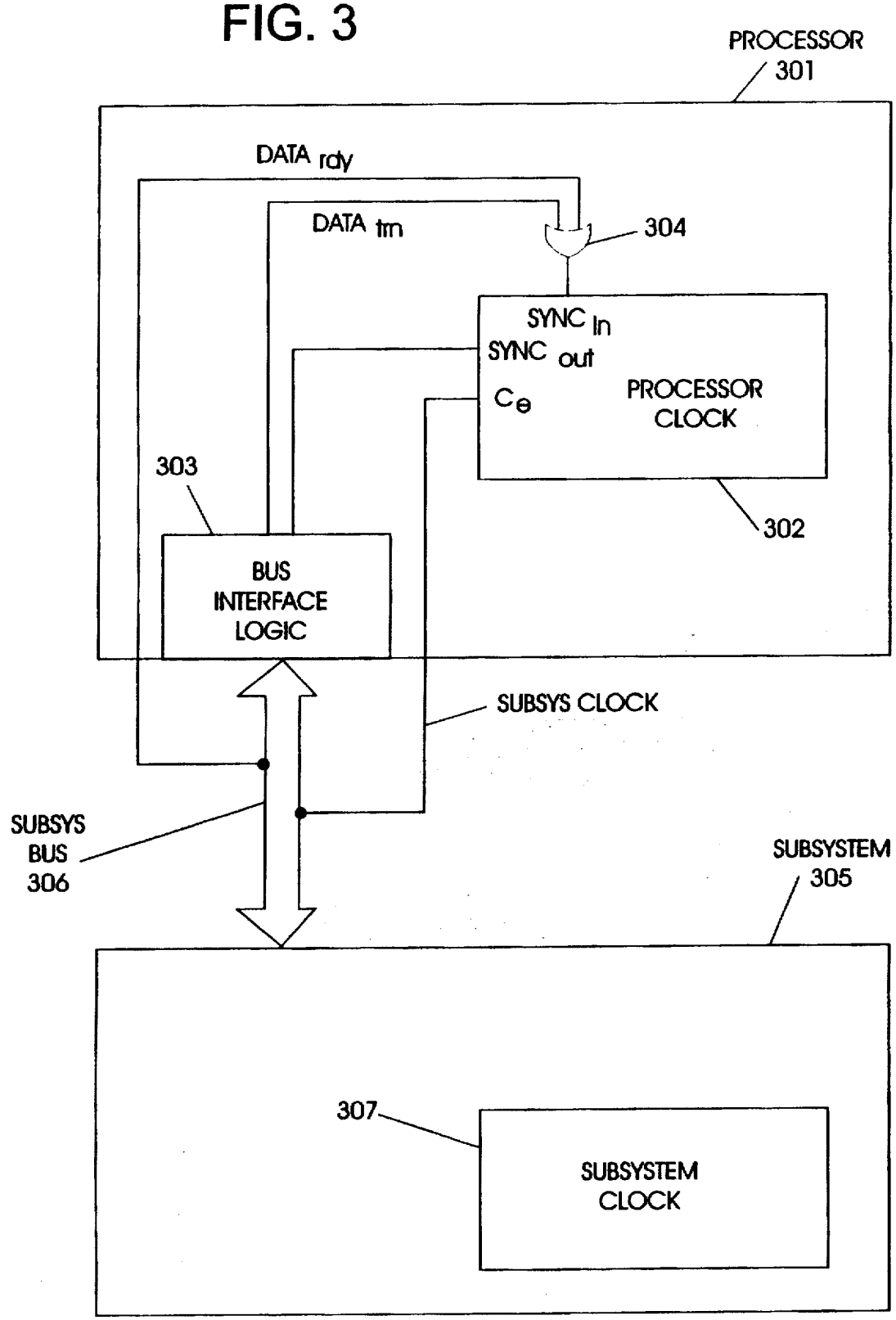
FIG. 3 is a block diagram of a processor and subsystem in which the processor clock can be momentarily synchronized to the subsystem clock during data transfers.

FIG. 3 is a block diagram of a processor and subsystem according to the present invention. Referring to this figure, a processor 301 includes a processor clock 302 and a well known bus interface logic circuit 303. A well known "data transfer" or $DATA_{trn}$ signal output from bus interface logic 303 is coupled to the $SYNC_{in}$ input of processor clock 302 through a first input of OR gate 304. $DATA_{trn}$ goes active whenever processor 301 has data that needs to be transferred to subsystem 305 over subsystem bus 306. Subsystem 305 includes its own independent clock, subsystem clock 307, which is coupled to a subsystem clock line of subsystem bus 306. The subsystem clock line is also connected to an "external clock" or $C_e$ input of processor clock 302. A well known "data ready" or $DATA_{rdy}$ line of subsystem bus 306 is also coupled to the $SYNC_{in}$ input of processor clock 302 through a second input of OR gate 304. $DATA_{rdy}$ goes active whenever subsystem 305 (or other subsystem or device coupled to bus 306) has data to transfer. Consequently, whenever $DATA_{rdy}$ or $DATA_{trn}$ goes active, the output of OR gate 304 goes active, pulling the $SYNC_{in}$ input of processor clock 302 active. With $SYNC_{in}$ active, processor clock 301 synchronizes its internal clock to the external clock signal at $C_e$. $SYNC_{out}$ is active when the processor clock is synchronized to the external clock signal $C_e$ and activation of this signal indicates to bus interface logic 303 that the two clocks are now synchronized.

Figure 4:
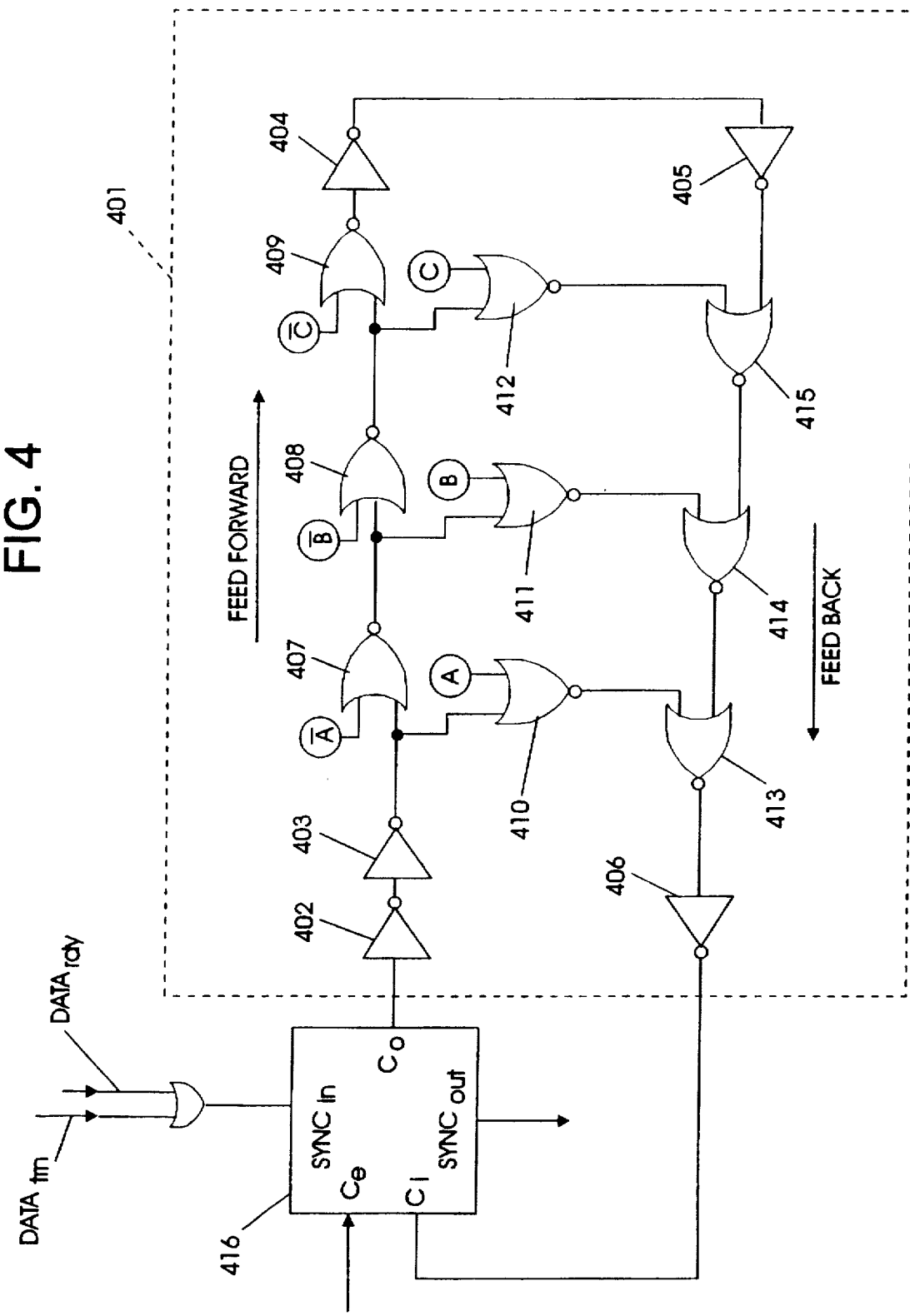
FIG. 4 is a schematic diagram of the processor clock of FIG. 3, which includes a ring oscillator and circuitry for synchronizing the oscillator to an external clock $C_e$.

FIG. 4 is a schematic diagram of one embodiment of the processor clock 302. Referring to this figure, a ring oscillator 401 includes inverters 402-406, NOR gates 407-409 in a "feed forward" path, NOR gates 410-412 in a "cross over" path, and NOR gates 413-415 in a "feed back" path. Briefly, when the output of inverter 406 is coupled to the input of inverter 402 through synchronizing circuit 416, a closed loop is formed and the frequency of oscillation is determined by the total number of inverting stages effectively in the loop. More precisely, the frequency of oscillation is determined by the sum of the propagation delays of the signal through each one of the stages in the loop.

The number of stages in the loop is determined by a control circuit (not illustrated) that sets the appropriate control lines "A", "B" and "C" either active or inactive. For example, with A=1, B=0 and C=1, the outputs of NOR gates 410 and 412 in the "cross over" path are forced to 0, effectively switching NOR gates 410 and 412 OFF. However, since B=0, NOR gate 411 functions as an inverter by inverting the output of NOR gate 407 in the feed forward path and coupling it to the input of NOR gate 414 in the feed back path. This forms a closed loop consisting of inverters 402-403, NOR gates 407, 411, 414 and 413, inverter 406 and sync circuit 416 (assuming that sync circuit 416 is in a mode in which it is not synchronized to an external clock signal $C_e$). Ring oscillator 401 is more fully described in U.S. Pat. No. 4,978,927, which is incorporated into this application by reference.

In one embodiment of the invention, oscillator 401 is integrally formed as part of the integrated circuit that includes processor 301. In other words, oscillator 401 is formed on the same silicon chip or other semiconductor material as processor 301. In this embodiment, it is also preferable, although not essential, that oscillator 401 be constructed using the same integrated circuit manufacturing technology as processor 301. For example, if processor 301 is constructed using a specific bipolar technology, then oscillator 401 is also constructed using the same bipolar technology.

The temperature of a semiconductor chip and the voltage applied to that chip directly effect the propagation delay of signals through each of the gates and other circuits on the chip. For example, as the temperature goes up, the propagation delay usually increases, effectively reducing the maximum operating speed of the chip. Thus, in a conventional computer system, the maximum operating speed of a processor is usually selected based on worst case temperature and voltage conditions and a fixed frequency oscillator is used (the oscillator frequency being selected based on those worst case conditions). Under different conditions of temperature and voltage, the maximum operating speed of the processor may increase significantly. In a conventional system, however, the processor is constrained by the fixed frequency oscillator and any improvement in processor maximum performance capability is unusable.

In the embodiment of the current invention in which oscillator 401 and processor 301 are constructed on the same chip, changes in temperature and voltage that cause improvements in the maximum operating speed of the processor, also cause corresponding changes to the frequency of the oscillator. In other words, as the maximum operating speed of the processor increases, a corresponding increase in the frequency of the oscillator also occurs.

Sync circuit 416 synchronizes the internal clock signal of the ring oscillator at input $C_i$ to an external clock signal (the subsystem clock) at input $C_e$, but only when $SYNC_{in}$ is active. When $SYNC_{in}$ is inactive, the processor clock free runs at its own internal frequency. Sync circuit 416 is preferably implemented as a well know state machine operating according to the state diagram and state table illustrated in FIGS. 5 and 6, respectively.

Figures 5, 6:
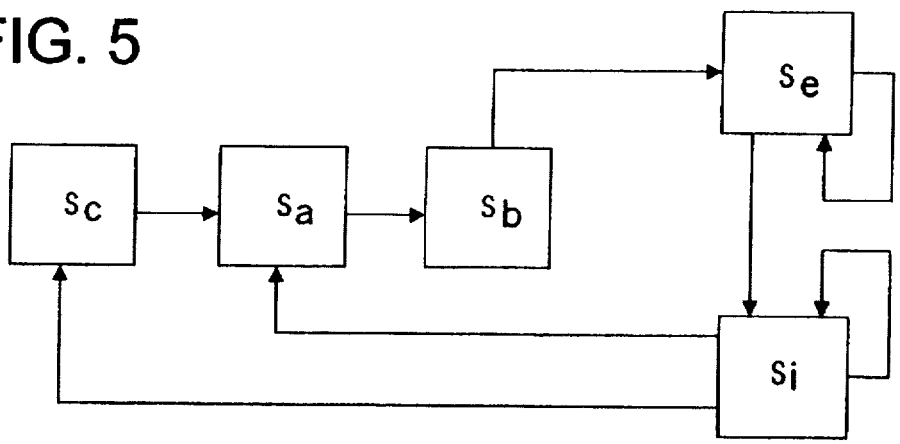
FIGS. 5-6 are, respectively, a state diagram and a state table of the synchronizing circuitry of FIG. 4, which may be implemented as a state machine.

Referring to FIGS. 5 and 6, a state diagram and state table are illustrated having six states $S_a$, $S_b$, $S_c$, $S_e$ and $S_j$. Briefly, state $S_i$ is the state sync circuit 416 is in when the internal processor clock is free running and not synchronized to the external subsystem clock, while state $S_e$ is the state after synchronization has occurred. States $S_a$, $S_b$ and $S_c$ are transitional states. For example, if the processor clock is free running and $SYNC_{in}$ is inactive (0), the 1st and 2nd lines of the state table of FIG. 6 indicate that the "next state" will be the same state or $S_j$. The timing diagram for the $S_i$ state is illustrated in FIG. 7.

Figure 9:
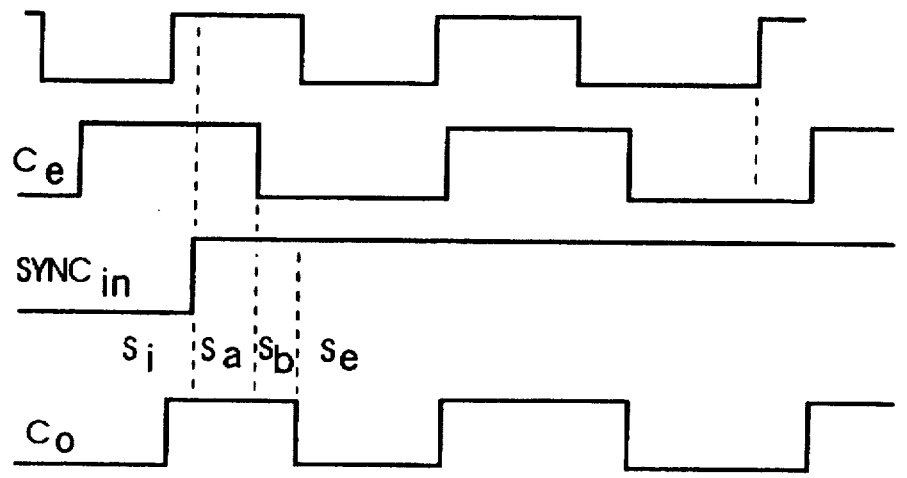
FIG. 9 is a timing diagram illustrating the $S_i$ to $S_e$ state transition wherein $C_i$ and $C_e$ have the same polarity when $SYNC_{in}$ transitions active, and wherein $C_i$ lags $C_e$.
Figure 10:
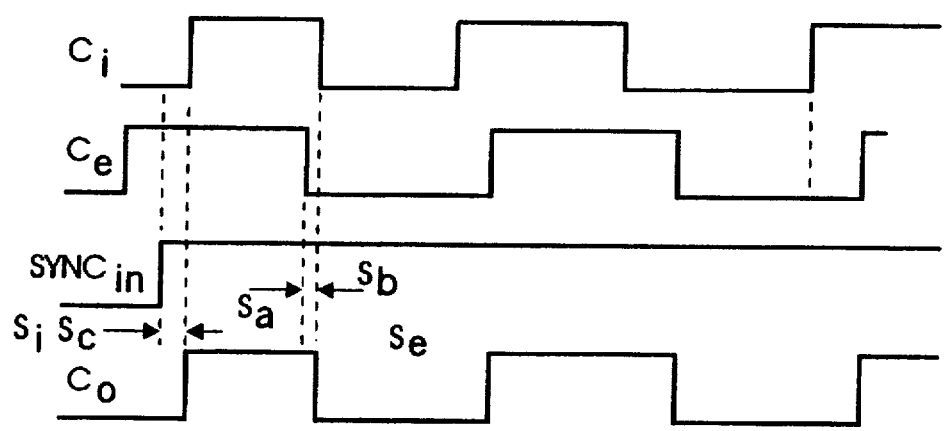
FIG. 10 is a timing diagram illustrating the $S_i$ to $S_e$ state transition wherein $C_i$ and $C_e$ have different polarities when $SYNC_{in}$ transitions active, and wherein $C_i$ lags $C_e$.
Figure 11:
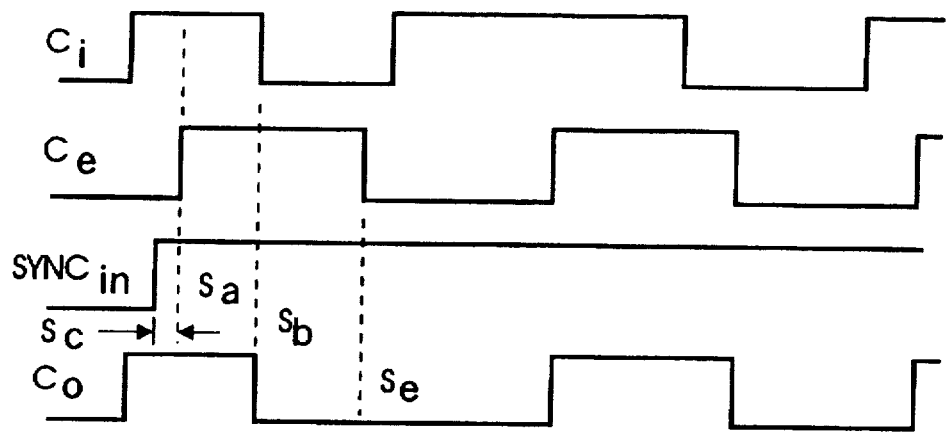
FIG. 11 is a timing diagram illustrating the $S_i$ to $S_e$ state transition wherein $C_i$ and $C_e$ have different polarities when $SYNC_{in}$ transitions active, and wherein $C_i$ leads $C_e$.

If $SYNC_{in}$ goes active while both $C_i$ and $C_e$ are high, as illustrated in the 3rd line of the state table, the next state will be state $S_a$. After reaching state $S_a$, the next state will be state $S_b$, as indicated in the 7th and 8th lines of the state table. From state $S_b$, the sync circuit moves to state $S_e$, as indicated in the 11th and 12th lines of the table. Once in state $S_e$, and provided that $SYNC_{in}$ remains active (1), $SYNC_{out}$ will be active (1) and the internal clock will be synchronized to the external clock at input $C_e$, as indicated in lines 13 and 14 of the state table. The timing diagrams for the transition from the $S_i$ to the $S_e$ state wherein $C_i$ and $C_e$ are both high when $SYNC_{in}$ transitions active is illustrated in FIGS. 8 and 9 (FIGS. 8 and 9 differ in that, in FIG. 8, $C_i$ transitions low prior to $C_e$ while, in FIG. 9, $C_e$ transitions before $C_i$). In addition, FIGS. 10 and 11 illustrate similar timing diagrams wherein $C_e$ and $C_i$ are of opposite polarity when $SYNC_{in}$ transitions active.

Figure 12:
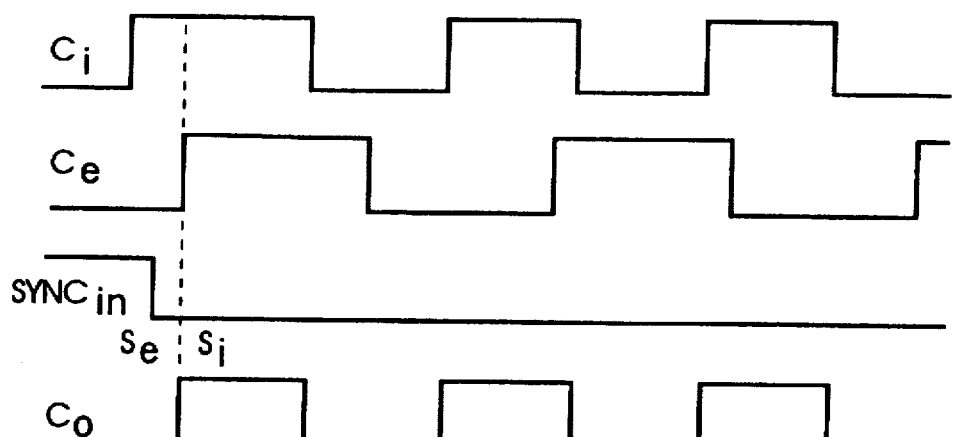
FIG. 12 is a timing diagram illustrating the $S_e$ to $S_i$ state transition.

After transferring data between processor 301 and subsystem 305, synchronization is no longer required and, because the processor clock free runs at a frequency higher than the subsystem clock frequency, it is desirable to let the processor run asynchronously again. This transition is illustrated in the last two lines of the state table wherein $SYNC_{in}$ has transitioned inactive (0) and the "next state" is state $S_j$. The timing diagram for the transition from state $S_e$ to state $S_i$ is illustrated in FIG. 12.

Referring to the timing diagrams of FIGS. 8–11, note one important feature of sync circuit 416; specifically, at no point in the transition from state $S_i$ to state $S_e$ is any period (or half period) of the processor clock (Ci) ever shorter than its period (or half period) in the free running, asynchronous state. In other words, sync circuit 416 always "stretches" the processor clock until it synchronizes itself with the external subsystem clock, thereby preventing any one cycle or half cycle of the processor clock from exceeding the maximum operating speed of the processor.

We claim as our invention:

1. A computer system, comprising:

an integrated circuit chip including a processor and a processor clock, said processor including a plurality of gates, said processor clock including a free running, variable frequency oscillator wherein, in an asynchronous mode, the frequency of said processor clock is determined in part by the temperature of said chip and the voltage applied to said chip such that, as the propagation delay of said gates decreases with changes in the temperature and the voltage, the frequency of said processor clock increases, and as the propagation delay of said gates increases with changes in the temperature and the voltage, the frequency of said processor clock decreases;

a computer subsystem having a subsystem clock, said computer subsystem being coupled to said processor such that data can be transferred between said processor and said subsystem;

signaling means for generating a synchronizing signal that precedes a transfer of a block of data between said processor and said subsystem;

synchronizing means for providing momentary synchronization of said processor clock and said subsystem clock, said momentary synchronization being initialized by said synchronizing signal and terminating upon the completion of the transfer of a block of data;

whereby said processor clock operates in a selected one of the asynchronous mode in which said processor clock and said subsystem clock are unsynchronized, and a synchronous mode in which said processor clock is synchronized to said subsystem clock, said synchronous mode being selected during the transfer of a block of data.

2. The computer system of claim 1, wherein said variable frequency oscillator is a ring oscillator.

3. The computer system of claim 2, wherein said synchronizing means includes a state machine that, in response to a synchronizing signal, stretches the pulse width of the processor clock until synchronization is achieved.

4. The computer system of claim 1, wherein said synchronizing means includes a state machine that, in response to a synchronizing signal, stretches the pulse width of the processor clock until synchronization is achieved.

* * * * *